(12) United States Patent
Zhang et al.

(10) Patent No.: US 11,245,100 B2
(45) Date of Patent: Feb. 8, 2022

(54) OLED DEVICE, MANUFACTURING METHOD THEREOF AND DISPLAY DEVICE

(71) Applicants: BOE Technology Group Co., Ltd., Beijing (CN); Beijing BOE Display Technology Co., Ltd., Beijing (CN)

(72) Inventors: Jiliang Zhang, Beijing (CN); Xin He, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/871,639

(22) Filed: Jan. 15, 2018

(65) Prior Publication Data

US 2018/0366683 A1 Dec. 20, 2018

(30) Foreign Application Priority Data

Jun. 15, 2017 (CN) .......................... 201710452441.9

(51) Int. Cl.
| | |
|---|---|
| *H01L 51/52* | (2006.01) |
| *H01L 51/50* | (2006.01) |
| *H01L 27/32* | (2006.01) |
| *H01L 51/00* | (2006.01) |

(52) U.S. Cl.
CPC ...... *H01L 51/5262* (2013.01); *H01L 27/3211* (2013.01); *H01L 51/0003* (2013.01); *H01L 51/0021* (2013.01); *H01L 51/5032* (2013.01); *H01L 51/5092* (2013.01); *H01L 51/0035* (2013.01); *H01L 2251/305* (2013.01); *H01L 2251/5369* (2013.01)

(58) Field of Classification Search
None
See application file for complete search history.

(56) References Cited

U.S. PATENT DOCUMENTS

| | | | | |
|---|---|---|---|---|
| 9,773,447 | B2 * | 9/2017 | Yang | ............... G09G 3/3208 |
| 2007/0046195 | A1 * | 3/2007 | Chin | ............... H01L 27/3211 |
| | | | | 313/506 |
| 2012/0176025 | A1 * | 7/2012 | Lee | ............... H01L 27/3206 |
| | | | | 313/503 |
| 2013/0140533 | A1 * | 6/2013 | Lee | ............... H01L 51/5265 |
| | | | | 257/40 |
| 2014/0183471 | A1 * | 7/2014 | Heo | ............... H01L 27/322 |
| | | | | 257/40 |

(Continued)

*Primary Examiner* — Abul Kalam
(74) *Attorney, Agent, or Firm* — Nath, Goldberg & Meyer; Joshua B. Goldberg

(57) ABSTRACT

The application provides an OLED device, a manufacturing method thereof, and a display device, which reduce or eliminate color cast in an image displayed by an existing OLED device due to different lifetimes of organic materials for light emitting layers emitting light of different colors in the OLED device. In the OLED device, a luminous efficiency regulator is disposed between a cathode and a light emitting layer of at least one sub-pixel, and a vibration characteristic peak of the luminous efficiency regulator falls within a wavelength range of light emitted from the corresponding light emitting layer, such that attenuation rates of lighting luminance of the light emitting layers emitting light of different colors are kept consistent with each other over time.

19 Claims, 4 Drawing Sheets

(56) References Cited

U.S. PATENT DOCUMENTS

| | | | |
|---|---|---|---|
| 2015/0287949 A1* | 10/2015 | Okamoto | H01L 51/5004 |
| | | | 257/40 |
| 2016/0126499 A1* | 5/2016 | Dai | H01L 51/5262 |
| | | | 257/40 |
| 2016/0358983 A1* | 12/2016 | Shi | H01L 27/3209 |
| 2017/0261663 A1* | 9/2017 | Li | C23C 16/44 |

* cited by examiner

OLED DEVICE, MANUFACTURING METHOD THEREOF AND DISPLAY DEVICE

CROSS-REFERENCE TO RELATED APPLICATION

The present application claims priority to Chinese Patent Application No. 201710452441.9, titled "OLED DEVICE, MANUFACTURING METHOD THEREOF AND DISPLAY DEVICE", filed on Jun. 15, 2017, the disclosure of which is hereby incorporated by reference in its entirety.

TECHNICAL FIELD

The present disclosure relates to the field of OLED technology, and in particular to an OLED device, a manufacturing method thereof, and a display device.

BACKGROUND

With the development of the technology to fully colorize an organic light emitting diode (OLED) device, the most common full-colorization technologies currently available include a fine-metal-mask (FMM) vacuum evaporation method, a color filter method (also referred to as a "white light+color filter" method, which is simply referred to as "W+CF"), and a blue color conversion method (also referred to as a "blue+color conversion method", which is simply referred to as "(blue+CCM)"), etc.

SUMMARY

The present disclosure provides an OLED device, which includes: a plurality of pixels, each of which including a plurality of sub-pixels of different colors, each of the plurality of sub-pixels including a cathode, an anode, and a light emitting layer provided between the cathode and the anode, wherein, as for each sub-pixel of at least one sub-pixel of the plurality of sub-pixels, a luminous efficiency regulator is disposed between the cathode and the light emitting layer of at least one of the plurality of sub-pixels, and a vibration characteristic peak of the luminous efficiency regulator is adjusted to fall within a wavelength range of light emitted from the light emitting layer corresponding to the luminous efficiency regulator, such that attenuation rates of lighting luminance of the plurality of sub-pixels are kept consistent with each other over time.

Optionally, the light emitting layers of the plurality of sub-pixels of different colors include a first color light emitting layer, a second color light emitting layer and a third color light emitting layer; and a first luminous efficiency regulator is arranged between the cathode and the first color light emitting layer and a second luminous efficiency regulator is arranged between the cathode and the second color light emitting layer, such that attenuation rates of lighting luminance of the first color light emitting layer, the second color light emitting layer and the third color light emitting layer are kept consistent with each other over time.

Optionally, the first color light emitting layer is a red light emitting layer, the second color light emitting layer is a blue light emitting layer, and the third color light emitting layer is a green light emitting layer; and a vibration characteristic peak of the luminous efficiency regulator corresponding to the red light emitting layer falls within a wavelength range of light emitted from the red light emitting layer; and a vibration characteristic peak of the luminous efficiency regulator corresponding to the blue light emitting layer falls within a wavelength range of light emitted from the blue light emitting layer.

Optionally, the luminous efficiency regulator includes: a charged polymer electrolyte provided on the cathode, a metal oxide layer provided on the charged polymer electrolyte, and metal nanoparticles embedded in the metal oxide layer.

Optionally, the charged polymer electrolyte and surfaces of the metal nanoparticles are oppositely charged.

Optionally, the charged polymer electrolyte includes polydiallyldimethylammonium chloride (PDDA).

Optionally, the metal oxide layer includes a ZnO layer.

Optionally, the ZnO layer is configured to be an electron injection layer of the OLED device.

Optionally, the metal nanoparticles include any one or more of gold nanosphere particles, gold nanorod particles, silver nanorod particles, and gold-silver nanowire particles.

Optionally, both the metal nanoparticles in the luminous efficiency regulator corresponding to the blue light emitting layer and the metal nanoparticles in the luminous efficiency regulator corresponding to the red light emitting layer are silver nanorod particles.

Optionally, a length direction of the silver nanorod particles, the gold nanorod particles or the gold-silver nanowire particles extends in a plane where the metal oxide layer is located, and a size in a thickness direction of the silver nanorod particles, the gold nanorod particles or the gold nanowire particles is smaller than a thickness of the metal oxide layer.

Optionally, a length-width ratio of each of the metal nanopatticals ranges from 1 to 10.

Optionally, a content of the metal nanoparticles in the luminous efficiency regulator is determined according to the attenuation rate of the lighting luminance of the light emitting layer corresponding to the luminous efficiency regulator.

Optionally, a content of the metal nanoparticles in the luminous efficiency regulator corresponding to the blue light emitting layer is higher than a content of the metal nanoparticles in the luminous efficiency regulator corresponding to the red light emitting layer.

Optionally, the cathode is made of ITO.

The present disclosure further provides a method for manufacturing the OLED device as described above, the method including steps of: forming the luminous efficiency regulator on the cathode, forming the light emitting layer on the luminous efficiency regulator, and forming the anode on the light emitting layer.

Optionally, the step of forming the luminous efficiency regulator on the cathode includes steps of: treating the cathode to make it have negative charges on its surface, then immersing the cathode in charged polymer electrolyte to make the surface of the cathode have positive charges thereon, attaching metal nanoparticles to the surface of the cathode having positive charges thereon, and coating metal oxide on the cathode attached with the metal nanoparticles.

Optionally, the step of attaching metal nanoparticles to the surface of the cathode having positive charges thereon includes a step of: adjusting a quantity of the attached metal nanoparticles according to the attenuation rate of the lighting luminance of a corresponding light emitting layer.

The present disclosure further provides a display device including the OLED device as described above.

BRIEF DESCRIPTION OF THE FIGURES

Specific embodiments of the present disclosure are described below with reference to the accompanying drawings, but the present disclosure is not limited thereto, wherein.

DETAILED DESCRIPTION

The present disclosure will be further described below in conjunction with the accompanying drawings and specific implementations in order that a person skilled in the art can understand the technical solutions of the present disclosure better.

Figure 1:
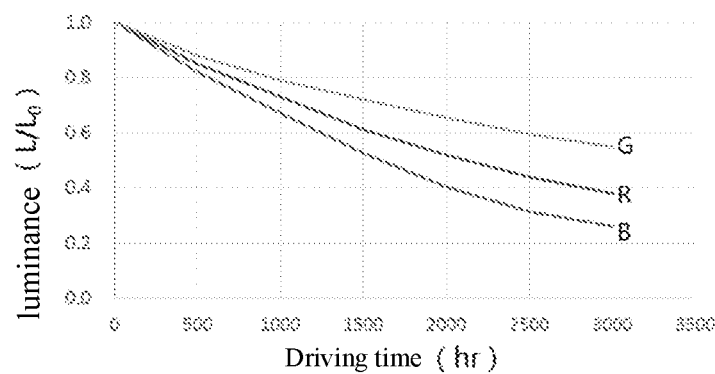
FIG. 1 is a schematic graph showing luminance attenuation with driving time of an existing OLED device.

The decay rates of organic materials for different light emitting layers in an OLED device are generally different, which will cause color cast in an image displayed by an OLED display product including the OLED device after a period of driving time. Referring to FIG. 1, the decay rates of red (R), blue (B), and green (G) organic materials are not identical. For example, the lighting luminance of the red and blue organic materials begins to be attenuated significantly after the driving time reaches 500 hours (hrs), the attenuation rates of light emitted from the organic materials of light emitting layers emitting light of the three colors are significantly different, which will result in a phenomenon of low blue brightness and high green brightness in an image displayed by the OLED display product after long-term operation, and thus the displayed image is prone to undergo color cast.

Figure 2:
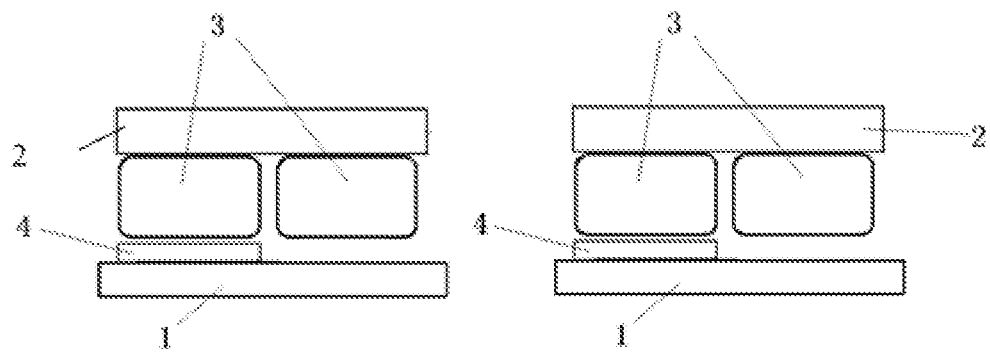
FIG. 2 is a schematic diagram showing a structure of an OLED device according to an embodiment of the present disclosure.
Figure 6:
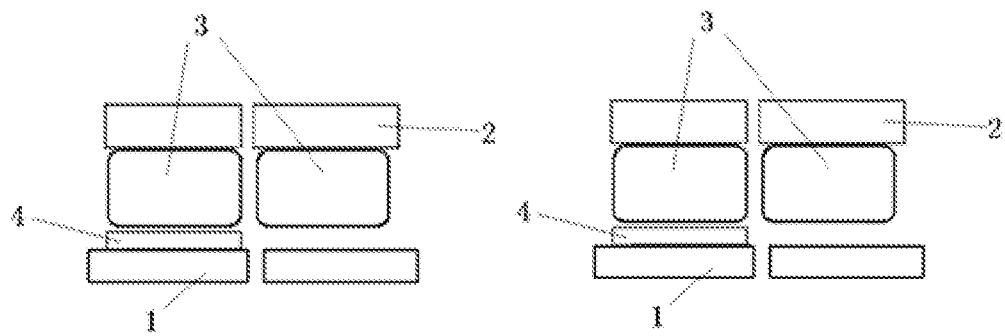
FIG. 6 is a schematic diagram showing a structure of an OLED device according to an embodiment of the present disclosure.

As shown in FIGS. 2 and 6, the present embodiment provides an OLED device, which includes a plurality of pixels, each of the plurality of pixels includes a plurality of sub-pixels of different colors, each of the plurality of sub-pixels includes a cathode 1, an anode 2, and a light emitting layer 3 provided between the cathode 1 and the anode 2. A luminous efficiency regulator 4 is disposed between the cathode 1 and the light emitting layer 3 of a sub-pixel of at least one of the plurality of sub-pixels. A vibration characteristic peak (i.e. Localized Surface Plasmon Resonance peak, LSPR peak for short) of the luminous efficiency regulator 4 can be adjusted to fall within a wavelength range of light emitted from the light emitting layer corresponding to the luminous efficiency regulator 4. Under the interaction of an excited state of a light emitting material and the local surface plasmon resonance of the luminous efficiency regulator, attenuation rates of lighting luminance of the plurality of sub-pixels are kept consistent with each other over time.

In the OLED device of the present embodiment, the luminous efficiency regulators 4 are disposed between the cathode 1 and the light emitting layers emitting light of multiple colors, respectively, such that a vibration characteristic peak of each of the luminous efficiency regulators 4 falls within a wavelength range of light emitted from the light emitting layer corresponding to the luminous efficiency regulator 4. In this way, the attenuation rates of the lighting luminance of the plurality of sub-pixels can be kept consistent with each other over time, and the lighting luminance of the light emitting layers regulated by the luminous efficiency regulators can be increased. Thus, a risk of white spot offset (i.e., the coordinates of a white spot is offset by a certain distance, and thus color cast will occur) is reduced, wherein the risk is caused by the attenuation rates of the light emitting characteristics of the light emitting layers emitting light of different colors being inconsistent with each other, and by the lighting luminance of a light emitting layer emitting light of a certain color decreasing significantly, as a time period during which the OLED device is driven becomes longer. Thus, luminance attenuation curves of the light emitting layers emitting light of different colors are adjusted to be substantially the same, thereby effectively avoiding color cast.

Specifically, FIG. 2 shows light emitting layers emitting light of two colors. A luminous efficiency regulator 4 is disposed between the light emitting layer emitting light of one color and the corresponding cathode 1, and a vibration characteristic peak of the luminous efficiency regulator 4 is regulated to fall within a wavelength range of light emitted from the light emitting material of the light emitting layer emitting light of the one color, such that the attenuation rates of lighting luminance of the light emitting layers emitting light of the two colors are kept consistent with each other over time. For example, the OLED device may be a billboard playing a certain screen for a long period of time. In a long-term use, attenuation rates of lighting luminance of light emitting layers emitting light of two colors are kept consistent with each other over time, and color cast will not occur.

Figure 3:
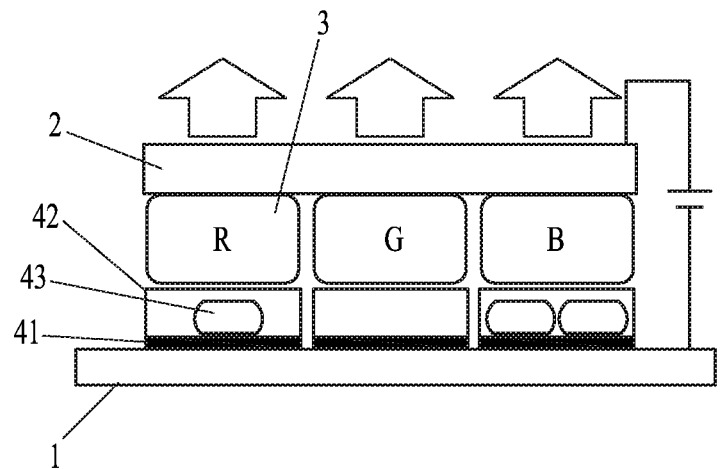
FIG. 3 is a schematic diagram showing a structure of an OLED device according to an embodiment of the present disclosure.
Figure 7:
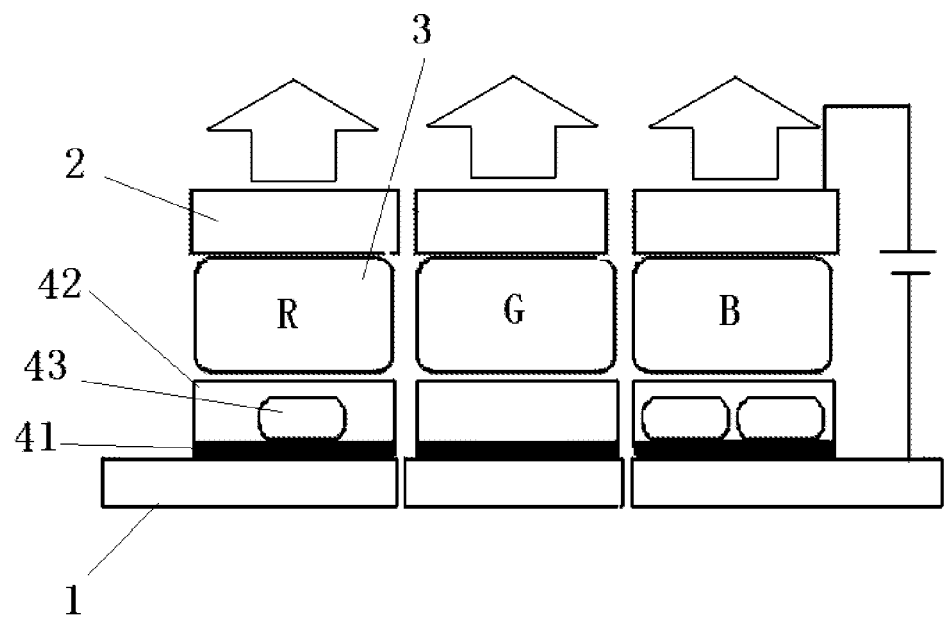
FIG. 7 is a schematic diagram showing a structure of an OLED device according to an embodiment of the present disclose.

As shown in FIGS. 3 and 7, this embodiment provides an OLED device including a plurality of pixels. For ease of description, FIG. 3 only shows one of the plurality of pixels. Each of the plurality of pixels may include a plurality of sub-pixels (e.g., three sub-pixels as shown in FIG. 3). Each sub-pixel of the OLED device includes a cathode 1, an anode 2, and a light emitting layer 3 provided between the cathode 1 and the anode 2. The OLED device shown in FIG. 3 includes a first color light emitting layer R, a second color light emitting layer B and a third color light emitting layer G. The luminous efficiency regulators 4 are disposed between the cathode 1 and the first color light emitting layer R and between the cathode 1 and the second color light emitting layer B, respectively, such that the attenuation rights of the lighting luminance of the first color light emitting layer R, the second color light emitting layer B and the third color light emitting layer G are kept consistent with each other over time.

That is, the OLED device includes three light emitting layers emitting light of three different colors, wherein the attenuation rate of the light emitting luminance of the third color light emitting layer G is less than the attenuation rate of the light emitting luminance of each of the first color light emitting layer R and the second color light emitting layer B. Herein, the luminous efficiency regulators 4 are disposed between the cathode 1 and the first color light emitting layer R and between the cathode 1 and the second color light emitting layer B, respectively, such that the attenuation rates of the lighting luminance of the three light emitting layers emitting light of the three colors are kept consistent with each other over time to prevent color cast from occurring. In this embodiment, the case of the three primary color sub-pixels is taken as an example for description, but the present disclosure is not limited thereto. For example, a case of four primary colors is similar to the case of the three primary color sub-pixels. Specifically, according to wavelength ranges of light emitted from light emitting layers emitting light of the four colors, the light emitting efficiency regulators 4 may be selectively disposed between one, two, or three color light emitting layers and the cathode 1, and may be adjusted, respectively, so that the attenuation rates of the light emitting luminance of the light emitting layers emitting light of the four colors are kept consistent with each other over time to prevent color cast from occurring.

As an alternative implementation of this embodiment, the first color light emitting layer R is a red light emitting layer, the second color light emitting layer B is a blue light emitting layer, and the third color light emitting layer G is a green light emitting layer. A vibration characteristic peak of the luminous efficiency regulator 4 corresponding to the red light emitting layer falls within a wavelength range of light emitted from the red light emitting layer. A vibration characteristic peak of the luminous efficiency regulator 4 corresponding to the blue light emitting layer falls within a wavelength range of light emitted from the blue light emitting layer.

That is, in the OLED device, the change of lighting luminance of a light emitting layer emitting light of a certain color over time may be represented by the following formula:

$$L(t) = L_0 \exp\left[-\left(\frac{t}{\tau}\right)^\beta\right]$$

Wherein, L (t) is the current lighting luminance of the light emitting layer emitting light of the certain color in the OLED device; $L_0$ is the initial lighting luminance of the light emitting layer; t is the driving time; τ is an attenuation time factor; β is an attenuation index. An attenuation rate depends on the attenuation time factor and the attenuation index. The attenuation rates of each of the red and blue light emitting layers is greater than that of the green light emitting layer. In addition, the attenuation rate of the blue light emitting layer is greater than that of the red light emitting layer. For example, as shown in FIG. 3, the fast attenuation of the lighting luminance of the red and blue light emitting layers 3 over time is compensated by reducing the lifetime of excitons in the red and blue light emitting layers 3 and increasing the photoluminescence efficiency of the red and blue light emitting layers 3 by using the luminous efficiency regulators 4. Thus, the lighting luminance attenuation curves of the red, green and blue light emitting layers can be regulated to be substantially the same without changing the aperture ratio of each of the pixels, so as to effectively reduce the color cast of a white spot. In this embodiment, the case of the red, green and blue primary color sub-pixels has been described as an example, but the present disclosure is not limited thereto. For example, a case of cyan, yellow and violet is similar to the case of the red, green and blue primary colors, and details thereof are omitted herein.

As an alternative implementation of this embodiment, the luminous efficiency regulator 4 includes: a charged polymer electrolyte 41 provided on the cathode 1; a metal oxide layer 42 provided on the charged polymer electrolyte 41; and metal nanoparticles 43 embedded in the metal oxide layer 42.

In a case where the OLED device is a top-emitting device, the luminous efficiency regulator 4 may be formed directly on the cathode 1 so as not to reduce the light transmittance of the OLED device, as shown in FIG. 3. The metal oxide layer 42 serves as a functional layer that assists in forming a composite cathode.

Optionally, the metal nanoparticles 43 include any one or more of gold nanosphere particles, gold nanorod particles, silver nanorod particles and gold-silver nanowire particles.

For example, the OLED device according to the present embodiment may be a top-emitting device, and at least one luminous efficiency regulator 4 is disposed on the cathode. One of transverse vibration characteristic peak and longitudinal vibration characteristic peak of the metal nanoparticles 43 may fall within a light wavelength range of light emitted from the light emitting layer 3 corresponding to the luminous efficiency regulator 4. In the present embodiment, silver nanorod particles will be taken as an example for description. Transverse vibration characteristic peaks and longitudinal vibration characteristic peaks of silver nanorod particles with different length-width ratios (i.e., L/W, where L is a length of each of the silver nanorod particles, and W is a maximal width of the silver nanorod particle in a direction perpendicular to the length direction of the silver nanorod particle) are shown in Table 1:

TABLE 1

| L (nm) | W (nm) | L/W | transverse vibration characteristic peak (nm) | longitudinal vibration characteristic peak (nm) |
|---|---|---|---|---|
| 33 | 33 | 1 | 420 | — |
| 43 | 12 | 3.5 | 420 | 535 |
| 214 | 21 | 10 | 420 | 615 |

When the length (L)-width (W) ratio of each of the silver nanorod particles is 1, the transverse vibration characteristic peak thereof is 420 nm. When the length (L)-width (W) ratio of each of the silver nanorod particles is 3.5, the transverse vibration characteristic peak thereof is 420 nm and the longitudinal vibration characteristic peak thereof is 535 nm. When the length (L)-width (W) ratio of each of the silver nanorod particles is 10, the transverse vibration characteristic peak thereof is 420 nm and the longitudinal vibration characteristic peak thereof is 615 nm. The International Commission on Illumination (CIE, Commission Internationale de L'Eclairage) regulates that the standard red primary color light has a wavelength of 700 nm and the standard blue primary color light has a wavelength of 435.8 nm. According to the vibration characteristic (LSPR) peak data in Table 1, the vibration characteristic peaks (i.e., the transverse vibration characteristic peak and the longitudinal vibration characteristic peak) of the metal nanoparticles 43 can be adjusted to be close to or overlap with wavelengths of light emitted from the red light emitting layer and the blue light emitting layer, to improve the luminous efficiencies thereof. Specifically, the transverse vibration characteristic peak of the metal nanoparticles 43 is adjusted to 420 nm to be close to or equal to the wavelength of the standard blue primary color light (435.8 nm), and the longitudinal vibration characteristic peak of the metal nanoparticles 43 is adjusted to 615 nm to be close to or equal to the wavelength of the standard red primary color light (700 nm). That is, when each of the silver nanorod particles has a length (L)-width (W) ratio of 10, the transverse and longitudinal vibration characteristic peaks thereof may close to the wavelength of the light emitted from the blue light emitting layer and the wavelength of the light emitted from the red light emitting layer, respectively. Therefore the silver nanorod particles may be used in the OLED device to adjust both lighting luminance attenuation curves of the red light emitting layer and the blue light emitting layer to be close to the lighting luminance attenuation curve of the green light emitting layer at the same time, so that the color cast of a white spot can be reduced or eliminated. It should be noted that, a wavelength of light emitted from the red light emitting layer may vary in a range, for example from 620 nm to 740 nm; a wavelength of light emitted from the blue light emitting layer may vary in a range, for example from 400 nm to 495 nm; and a wavelength of light emitted from the green light emitting layer may vary in a range, for example from 495 nm to 570 nm. In this case, the transverse vibration characteristic peak of the metal nanoparticles 43 may be adjusted to fall within the wavelength range of light emitted from the blue light emitting layer and the longitudinal vibration characteristic peak of the metal nanoparticles 43 may be adjusted to fall within the wavelength range of light emitted from the red light emitting layer. In this way, both lighting luminance attenuation curves of the red light emitting layer and the blue light emitting layer may be adjusted to be substantially the same as the lighting luminance attenuation curve of the green light emitting layer, so that the color cast is reduced or eliminated.

Optionally, the charged polymer electrolyte 41 and the surfaces of the metal nanoparticles 43 are oppositely charged.

For example, the charged polymer electrolyte 41 is a monomolecular layer, and the polarity of charges carried by the charged polymer electrolyte 41 is opposite to the polarity of charges carried by the surfaces of the metal nanoparticles 43, which facilitates the electrostatic adsorption of the metal nanoparticles 43. Optionally, the charged polymer electrolyte 41 includes polydiallyldimethylammonium chloride (PDDA).

Optionally, the metal oxide layer includes ZnO, and the cathode 1 is made of indium tin oxide (ITO).

Figure 4:
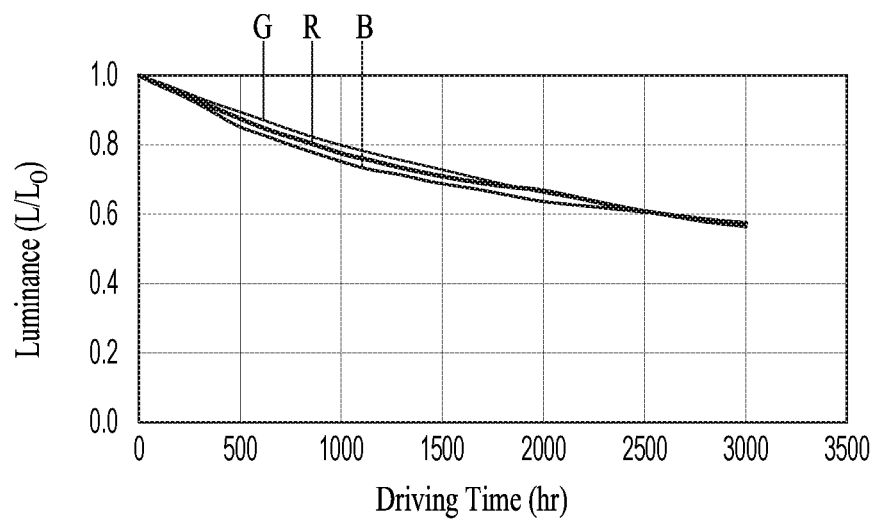
FIG. 4 is a schematic graph showing luminance attenuation with driving time of an OLED device according to an embodiment of the present disclosure.

For example, the OLED device in the present embodiment may be a bottom-emitting OLED, the cathode may be ITO with a work function of 4.7 eV, which is better matched with the metal nanoparticles 43 having a work function of (Au: 5.2 eV, Ag: 4.3 eV). FIG. 4 is a curve showing the change of the luminance attenuation of the OLED device according to the present embodiment over the driving time. From comparing FIG. 1 with FIG. 4, it can be seen that the OLED device of the present embodiment compensates for the fast attenuation of lighting luminance of the red and blue light emitting layers over time by reducing the lifetime of excitons in the red and blue light emitting layers 3 and enhancing the photoluminescence efficiencies of the red and blue light emitting layers 3, by using the luminous efficiency regulator 4, so that the lighting luminance attenuation curves of the red, green and blue light emitting layers can be adjusted to be substantially the same without changing the aperture ratio of each of the pixels, so as to effectively reduce or eliminate the color cast of a white spot.

Optionally, the length direction of the silver nanorod particles, gold nanorod particles or gold-silver nanowire particles extends in a plane where the metal oxide layer 42 is located, and a size in a thickness direction (i.e., a maximal width in a direction perpendicular to the length direction) of the silver nanorod particles, the gold nanorod particles or the gold nanowire particles is smaller than the thickness of the metal oxide layer 42.

A content of the metal nanoparticles 43 in the luminous efficiency regulator 4 can be adjusted or selected according to the luminance attenuation rate of the light emitting layer corresponding to the luminous efficiency regulator 4. Since the luminance attenuation rate of the red light emitting layer is generally 1.3 times as large as that of the green light emitting layer, and since the luminance attenuation rate of the blue light emitting layer is generally 1.6 times as large as that of the green light emitting layer, the content of the metal nanoparticles 43 in the luminous efficiency regulator 4 corresponding to the blue light emitting layer is higher than the content of the metal nanoparticles in the luminous efficiency regulator 4 corresponding to the red light emitting layer 43. Specifically, the efficiency improvement capability of the luminous efficiency regulator 4 is related to the content of the metal nanoparticles 43 in the luminous efficiency regulator 4. The purpose is to ensure that the light emitting layers emitting light of different colors, after their efficiencies being improved by the corresponding luminous efficiency regulators 4, have lighting luminance attenuation rates close to or equal to each other. Additionally, the effect of the silver (Ag) nanorod particles in enhancing the lighting efficiency of the light emitting layer depends not only on the content of the silver nanorod particles, but also on the efficiency required to be increased.

Figure 5:
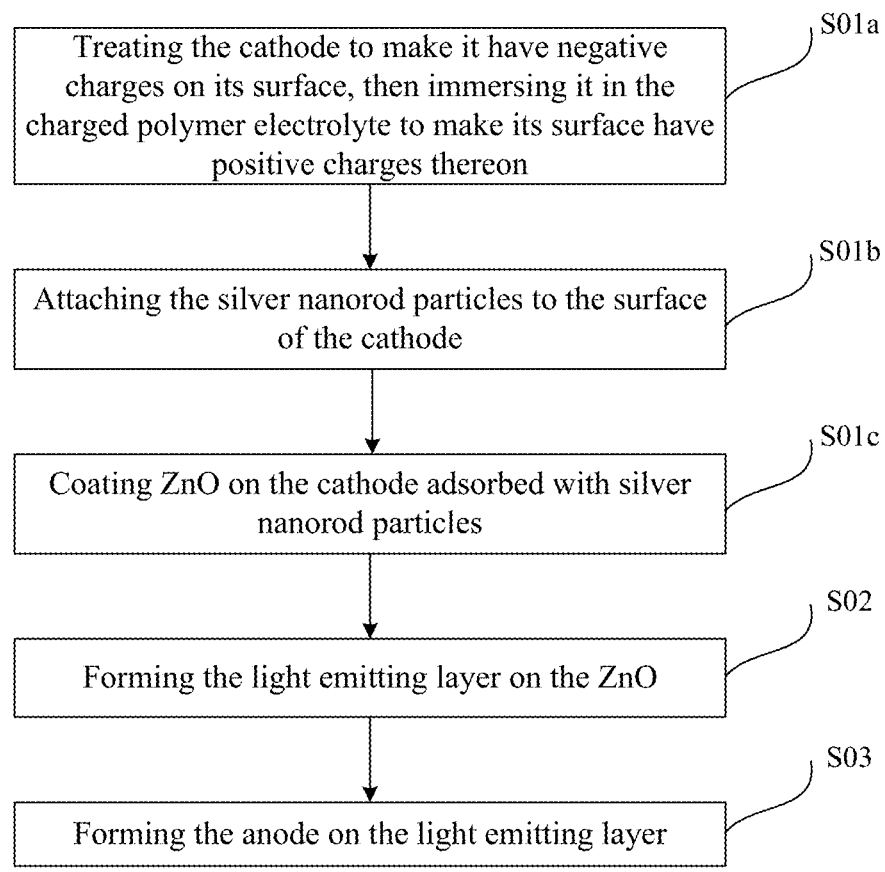
FIG. 5 is a flowchart illustrating a method for manufacturing an OLED device according to an embodiment of the present disclosure.

The present embodiment provides a method for manufacturing the above OLED device. As shown in FIG. 5, the method includes the following preparation steps S01, S02, and S03.

In the step S01, a luminous efficiency regulator is formed on the cathode. The step S01 may include the following preparation steps S01a to S01c. In the step S01a, treating the cathode to make it have negative charges on its surface, then immersing it in the charged polymer electrolyte to make its surface have positive charges thereon. Specifically, a clean ITO conductive glass is firstly processed through oxygen plasma treatment to make it have negative charges on its surface, and then immersed in a charged polymer electrolyte of polydiallyldimethylammonium chloride (PDDA), wherein the charged polymer electrolyte undergoes electrostatic adsorption by a layer-by-layer self-assembly method, so that the surface thereof has positive charges thereon. In the step S01b, the silver nanorod particles are electrostatically adsorbed on the surface of the cathode (i.e., the ITO conductive glass), in particular, the ITO conductive glass having charges on its surface is immersed in an Ag nanorod solution of a certain concentration, and Ag nanorods can be adsorbed on the ITO surface by electrostatic interaction; wherein, the Ag nanorod solution may be an inorganic (e.g. aqueous) monodispersed solution of Ag nanorods or an organic (e.g. chloroform, toluene and alcohol) monodispersed solution of Ag nanorods, and a concentration of the Ag nanorods can range from a few nanomoles per liter to a few millimoles per liter according to the requirements of the luminous efficiency regulators corresponding to the light emitting layers emitting light of different colors. In the step S01c, ZnO is coated on the cathode adsorbed with silver nanorod particles. In particular, in a super clean room, a thin ZnO layer is spin-coated on the ITO conductive glass modified by monodispersed Ag nanorods.

The step S02 includes forming a light emitting layer on the ZnO layer. It should be noted that, in the step S02, an electron transport layer (ETL) may be further formed before the light emitting layer is formed; after the light emitting layer is formed, a hole injection layer (HIL), a hole transport layer (HTL), and the like may also be formed. That is, the ZnO layer in the step S01 may be used as an electron injection layer (EIL). In this case, the silver nanorod particles are embedded in the electron injection layer of the OLED device to realize the luminous efficiency regulators. In order to meet light emitting requirements of different colors and different luminance, the number or the stacking order of the above functional layers may be changed.

In the step S03, an anode is formed on the light emitting layer. For example, the anode may be made of a transparent or translucent material.

Optionally, an encapsulation layer and the like may also be formed on the anode to obtain a top-emitting OLED device.

Obviously, many variations may be made to the implementations of the above embodiments. For example, materials of the light emitting layers emitting light of various colors may be selected as needed, and the functional layers in the OLED device may be stacked in a different order as required.

The present embodiment provides a display device, which includes the OLED device according to any one of the above embodiments. The display device may be any product or component having a display function such as an electronic paper, an OLED panel, a mobile phone, a tablet computer, a television, a display, a notebook computer, a digital photo frame, a navigator and the like.

It can be understood that the above embodiments are merely exemplary embodiments used for illustrating the principle of the present disclosure, but the disclosure is not limited thereto. For one of ordinary skill in the art, various modifications and improvements may be made without departing from the spirit and essence of the present disclosure, and these variations and improvements are also considered as falling within the protection scope of the present disclosure.

The invention claimed is:

1. An OLED device, comprising:
a plurality of pixels, each of which comprising a plurality of sub-pixels of different colors, each of the plurality of sub-pixels comprising a cathode, an anode, and a light emitting layer provided between the cathode and the anode, wherein,
the plurality of sub-pixels has at least one sub-pixel that comprises a luminous efficiency regulator disposed between the cathode and the light emitting layer of the sub-pixel, and a vibration characteristic peak of the luminous efficiency regulator is adjusted to fall within a wavelength range of light emitted from the light emitting layer, such that attenuation rates of lighting luminance of the plurality of sub-pixels are kept consistent with each other over time; and
the luminous efficiency regulator comprises:
a charged polymer electrolyte provided on the cathode,
a metal oxide layer provided on the charged polymer electrolyte, and
metal nanoparticles embedded in the metal oxide layer.

2. The OLED device of claim 1, wherein the light emitting layers of the plurality of sub-pixels of different colors comprise a first color light emitting layer, a second color light emitting layer and a third color light emitting layer; and the sub-pixel comprising the first color light emitting layer has the luminous efficiency regulator arranged between the cathode and the first color light emitting layer of the sub-pixel comprising the first color light emitting layer; and
the sub-pixel comprising the second color light emitting layer has the luminous efficiency regulator arranged between the cathode and the second color light emitting layer of the sub-pixel comprising the second color light emitting layer, such that attenuation rates of lighting luminance of the first color light emitting layer, the second color light emitting layer and the third color light emitting layer are kept consistent with each other over time.

3. The OLED device of claim 2, wherein, the first color light emitting layer is a red light emitting layer, the second color light emitting layer is a blue light emitting layer, and the third color light emitting layer is a green light emitting layer; and
a vibration characteristic peak of the luminous efficiency regulator corresponding to the red light emitting layer falls within a wavelength range of light emitted from the red light emitting layer; and
a vibration characteristic peak of the luminous efficiency regulator corresponding to the blue light emitting layer falls within a wavelength range of light emitted from the blue light emitting layer.

4. The OLED device of claim 3, wherein, the luminous efficiency regulator comprises:
a charged polymer electrolyte provided on the cathode,
a metal oxide layer provided on the charged polymer electrolyte, and
metal nanoparticles embedded in the metal oxide layer.

5. The OLED device of claim 1, wherein, the charged polymer electrolyte and surfaces of the metal nanoparticles are oppositely charged.

6. The OLED device of claim 1, wherein, the charged polymer electrolyte comprises polydiallyldimethylammonium chloride.

7. The OLED device of claim 1, wherein, the metal oxide layer comprises a ZnO layer.

8. The OLED device of claim 7, wherein, the ZnO layer is configured to be an electron injection layer of the OLED device.

9. The OLED device of claim 1, wherein, the metal nanoparticles comprise any one or more of gold nanosphere particles, gold nanorod particles, silver nanorod particles, and gold-silver nanowire particles.

10. The OLED device of claim 4, wherein, both the metal nanoparticles in the luminous efficiency regulator corresponding to the blue light emitting layer and the metal nanoparticles in the luminous efficiency regulator corresponding to the red light emitting layer are silver nanorod particles.

11. The OLED device of claim 9, wherein, a length direction of the silver nanorod particles, the gold nanorod particles or the gold-silver nanowire particles extends in a plane where the metal oxide layer is located, and
a size in a thickness direction of the silver nanorod particles, the gold nanorod particles or the gold-silver nanowire particles is smaller than a thickness of the metal oxide layer.

12. The OLED device of claim 10, wherein, a length-width ratio of each of the metal nanoparticles ranges from 1 to 10.

13. The OLED device of claim 1, wherein, a content of the metal nanoparticles in the luminous efficiency regulator is determined according to the attenuation rate of the lighting luminance of the light emitting layer corresponding to the luminous efficiency regulator.

14. The OLED device of claim 13, wherein, a content of the metal nanoparticles in the luminous efficiency regulator corresponding to the blue light emitting layer is higher than a content of the metal nanoparticles in the luminous efficiency regulator corresponding to the red light emitting layer.

15. The OLED device of claim 1, wherein, the cathode is made of ITO.

16. A display device, comprising the OLED device of claim 1.

17. A method for manufacturing the OLED device of claim 1, comprising steps of:
   forming the luminous efficiency regulator on the cathode such that the luminous efficiency regulator comprises: a charged polymer electrolyte provided on the cathode, a metal oxide layer provided on the charged polymer electrolyte, and metal nanoparticles embedded in the metal oxide layer,
   forming the light emitting layer on the luminous efficiency regulator, and
   forming the anode on the light emitting layer.

18. The method of claim 17, wherein, the step of forming the luminous efficiency regulator on the cathode comprises steps of:
   treating the cathode to make it have negative charges on its surface, then immersing the cathode in charged polymer electrolyte to make the surface of the cathode have positive charges thereon,
   attaching metal nanoparticles to the surface of the cathode having positive charges thereon, and
   coating metal oxide on the cathode attached with the metal nanoparticles.

19. The method of claim 18, wherein, the step of attaching metal nanoparticles to the surface of the cathode having positive charges thereon comprises a step of:
   adjusting a quantity of the attached metal nanoparticles according to the attenuation rate of the lighting luminance of a corresponding light emitting layer.

* * * * *